United States Patent
Herring et al.

(10) Patent No.: US 7,355,120 B2
(45) Date of Patent: Apr. 8, 2008

(54) CABLE MANAGEMENT SYSTEM

(75) Inventors: Dean F. Herring, Youngsville, NC (US); Daniel P. Kelaher, Holly Springs, NC (US); Glenn E. Myrto, Holly Springs, NC (US); Paul A. Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 255 days.

(21) Appl. No.: 11/168,585

(22) Filed: Jun. 28, 2005

(65) Prior Publication Data

US 2006/0289193 A1    Dec. 28, 2006

(51) Int. Cl.
*H02G 15/08* (2006.01)

(52) U.S. Cl. .................. 174/72 A; 174/481; 174/68.1; 174/68.3; 385/134; 385/135

(58) Field of Classification Search .................. 174/48, 174/49, 68.1, 68.3, 135, 72 A, 101, 100, 174/50, 54, 60, 97, 481, 69, 480; 385/134, 385/135; 211/26, 189; 248/56, 48, 68.1, 248/58, 65, 89; 361/826, 827, 825
See application file for complete search history.

(56) References Cited

U.S. PATENT DOCUMENTS

| | | | | |
|---|---|---|---|---|
| 5,640,482 A * | 6/1997 | Barry et al. | ................. | 385/135 |
| 6,070,742 A | 6/2000 | McAnally et al. | | |
| 6,127,631 A * | 10/2000 | Green et al. | ............... | 174/72 A |
| 6,181,862 B1 * | 1/2001 | Noble et al. | ................. | 385/135 |
| 6,326,547 B1 | 12/2001 | Saxby et al. | | |
| 6,327,159 B1 | 12/2001 | Davies et al. | | |
| 6,468,112 B1 * | 10/2002 | Follingstad et al. | ........ | 385/135 |
| 6,489,565 B1 * | 12/2002 | Krietzman et al. | ......... | 174/101 |
| 6,600,665 B2 * | 7/2003 | Lauchner | .................... | 361/826 |
| 6,686,541 B2 * | 2/2004 | Chan | ......................... | 174/68.1 |
| 6,747,874 B2 * | 6/2004 | McKinnon et al. | ........... | 211/26 |
| 6,805,248 B2 * | 10/2004 | Champion et al. | ............ | 211/26 |
| 6,867,701 B2 | 3/2005 | Lawrence et al. | | |
| 6,884,942 B2 * | 4/2005 | McGrath et al. | ........... | 174/68.1 |
| 6,902,069 B2 * | 6/2005 | Hartman et al. | .............. | 211/26 |
| 6,971,909 B2 * | 12/2005 | Levesque et al. | ........... | 385/134 |
| 2002/0191939 A1 | 12/2002 | Daoud et al. | | |
| 2003/0079901 A1 | 5/2003 | Chan | | |
| 2004/0057223 A1 | 3/2004 | Hall | | |

* cited by examiner

*Primary Examiner*—Angel R. Estrada
(74) *Attorney, Agent, or Firm*—Cardinal Law Group

(57) ABSTRACT

An electronic module rack system includes a rack housing and opposing first and second rail members attached to the housing. A stabilizer bar is attached to the first and second rail members. The rail members support a cable trough assembly, and at least one cable separator retainer extends from the cable trough assembly. A method for managing cables for an electronic module includes connecting a first cable to the electronic module and connecting a second cable to the electronic module. The first cable is placed in a cable trough assembly and the second cable is placed in a cable separator retainer extending from the cable trough assembly. A cable support system includes a cable trough assembly and means for supporting cables outside the cable trough assembly.

15 Claims, 5 Drawing Sheets

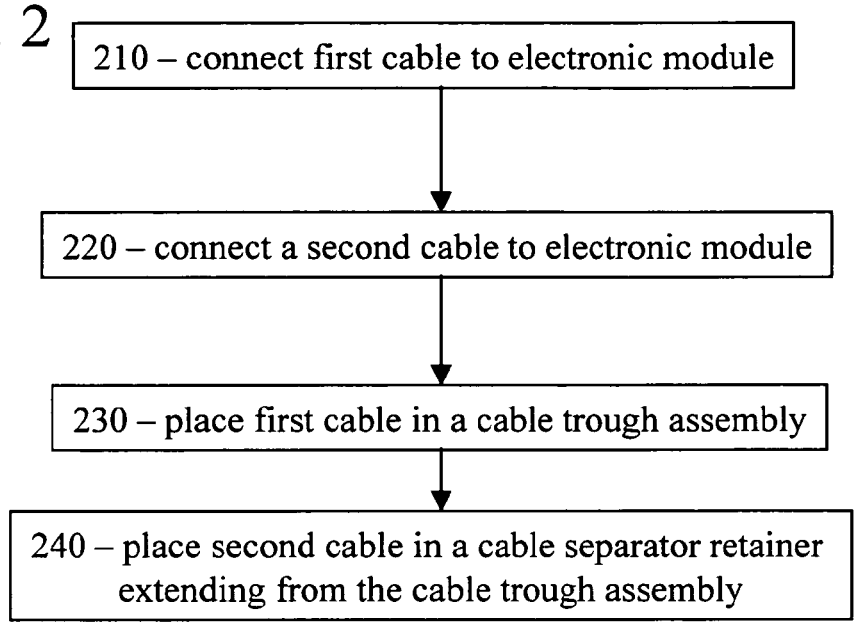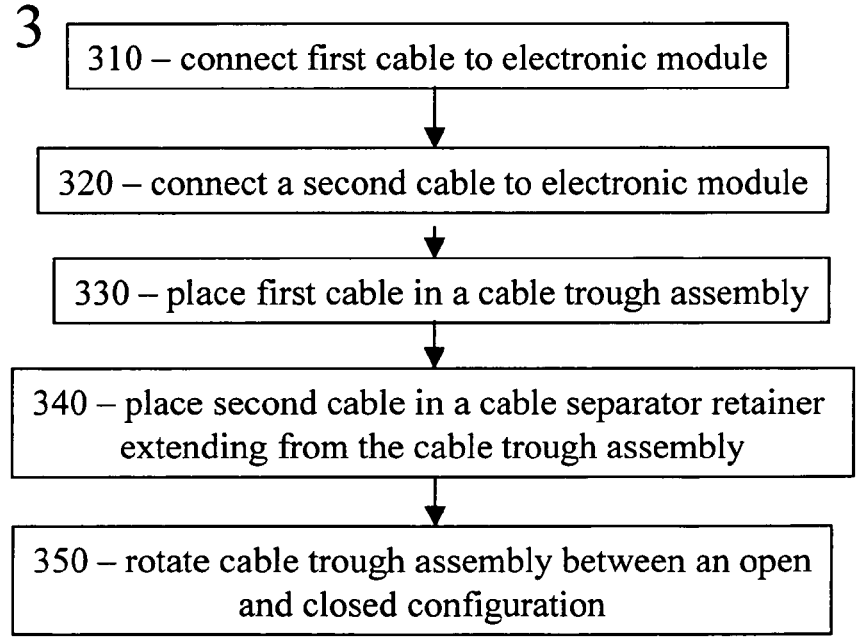

400

CABLE MANAGEMENT SYSTEM

FIELD OF INVENTION

The present invention generally relates to electronic module rack systems including cable management systems. More specifically, the invention relates to an electronic module rack system including cable separator retainers.

BACKGROUND OF THE INVENTION

Modern electronic modules are often placed in an electronic module rack during operation. Electronic module racks are generally configured to support a plurality of electronic modules, such as servers, and allow for maintenance of the supported electronic modules. Each electronic module is typically connected to other electronic modules with a number of cables. Each cable serves to deliver a signal, or power, to the electronic module.

With increasing complexity of electronic module systems, the number of cables needed for operation of each electronic module in a rack increases. Further, each cable often serves different purposes, is heavier or lighter than other cables, and often has different outer coverings. For example, one server relies on a power cable to supply power, a fiber cable to provide optical signals, a network cable (i.e., Ethernet) to communicate with a digital network, a controller device cable to connect to a controller device (i.e. keyboard, mouse), a monitor cable to connect to a monitor (such as a CRT, LCD or other visual display device).

In order to improve appearance, and improve maintenance, cable management systems provide means to tidy up a mess of cables. However, prior art cable management systems fail to address problems caused by storing cables of differing weight and outer materials in the same fashion. For example, certain cables have an outer covering that is 'sticky' and tends to partially adhere to neighboring cables. Movement of a cable that is partially adhered to another cable could pull one or both cables out of their respective connection with the electronic module—potentially disrupting the functioning of the electronic module. In another example, a heavier cable will tend to pull a lighter cable out of its connection if not properly monitored and care taken to avoid disruption. Cables of differing radii also present difficulties, as the different bend radii of the cables tends to cause cables to slide relative to each other, potentially trapping and pulling lighter cables out of their connections with the system.

Furthermore, when the system carries a lot of cables, the cable management system tends to droop. This drooping tends to reduce the stability and security of the cable attachments. Additionally, drooping may interfere with the operation of systems or devices held in the rack below the drooping arm.

It is therefore a challenge for the rack storage industry to develop devices and method to improve rack storage devices to overcome these, and other, disadvantages.

SUMMARY OF THE INVENTION

A first embodiment of the present invention is an electronic module rack system that includes a rack housing and opposing first and second rail members attached to the housing. A stabilizer bar is attached to the first and second rail members. The rail members support a cable trough assembly, and at least one cable separator retainer extends from the cable trough assembly.

A second embodiment of the present invention is a cable support system that includes a cable trough assembly and means for supporting cables outside the cable trough assembly.

A third embodiment of the present invention is a method for managing cables for an electronic module that includes connecting a first cable to the electronic module and connecting a second cable to the electronic module. The first cable is placed in a cable trough assembly and the second cable is placed in a cable separator retainer extending from the cable trough assembly.

The foregoing embodiment and other embodiments, objects, and aspects as well as features and advantages of the present invention will become further apparent from the following detailed description of various embodiments of the present invention. The detailed description and drawings are merely illustrative of the present invention, rather than limiting the scope of the present invention being defined by the appended claims and equivalents thereof.

BRIEF DESCRIPTION OF THE DRAWINGS

FIG. 2 illustrates an exemplary embodiment of a method for managing cables for an electronic module in accordance with the present invention;

FIG. 3 illustrates another exemplary embodiment of a method for managing cables for an electronic module in accordance with the present invention.

DETAILED DESCRIPTION OF THE PRESENT INVENTION

Figure 1A:
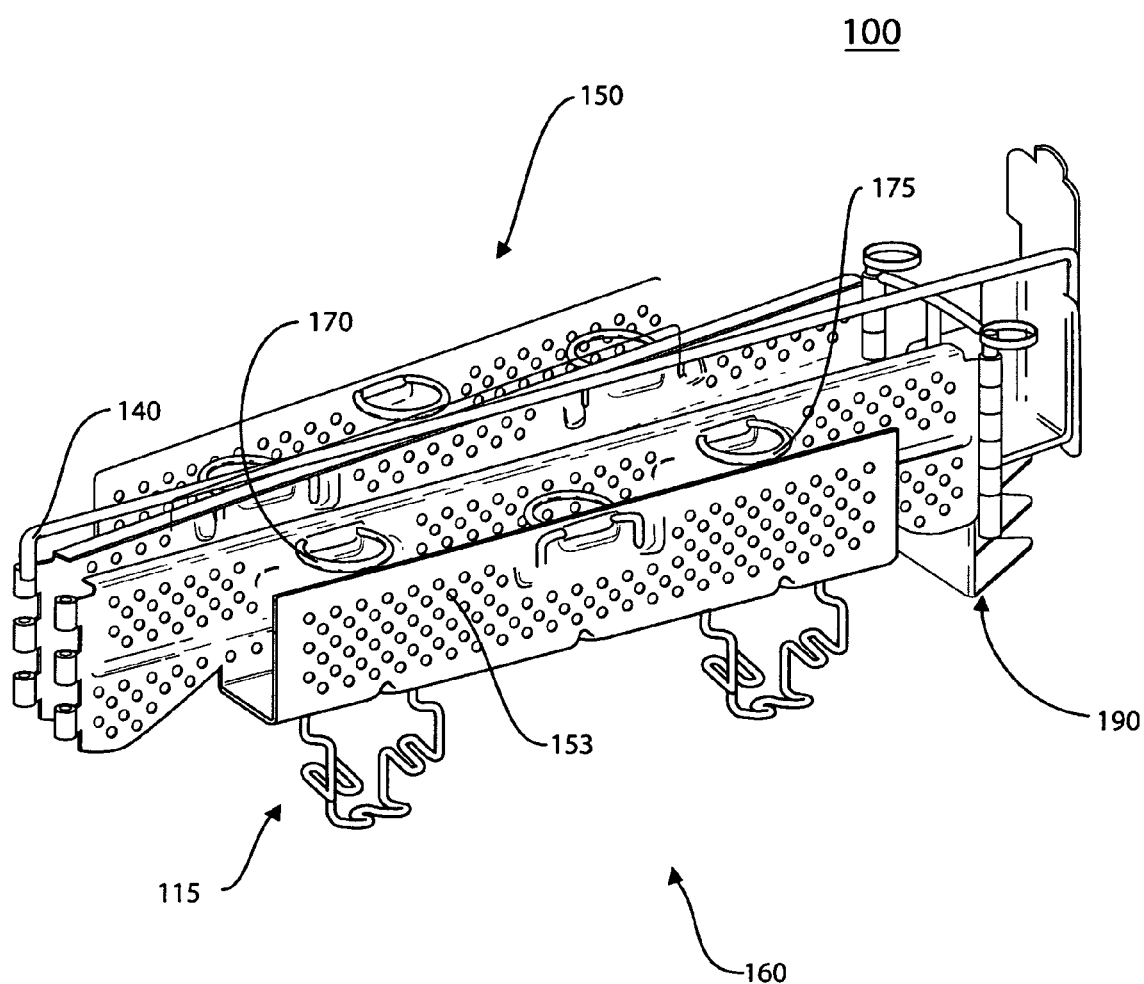
FIGS. 1A, 1B and 1C illustrate an exemplary embodiment of an electronic module rack system in accordance with the present invention.
Figure 1B:
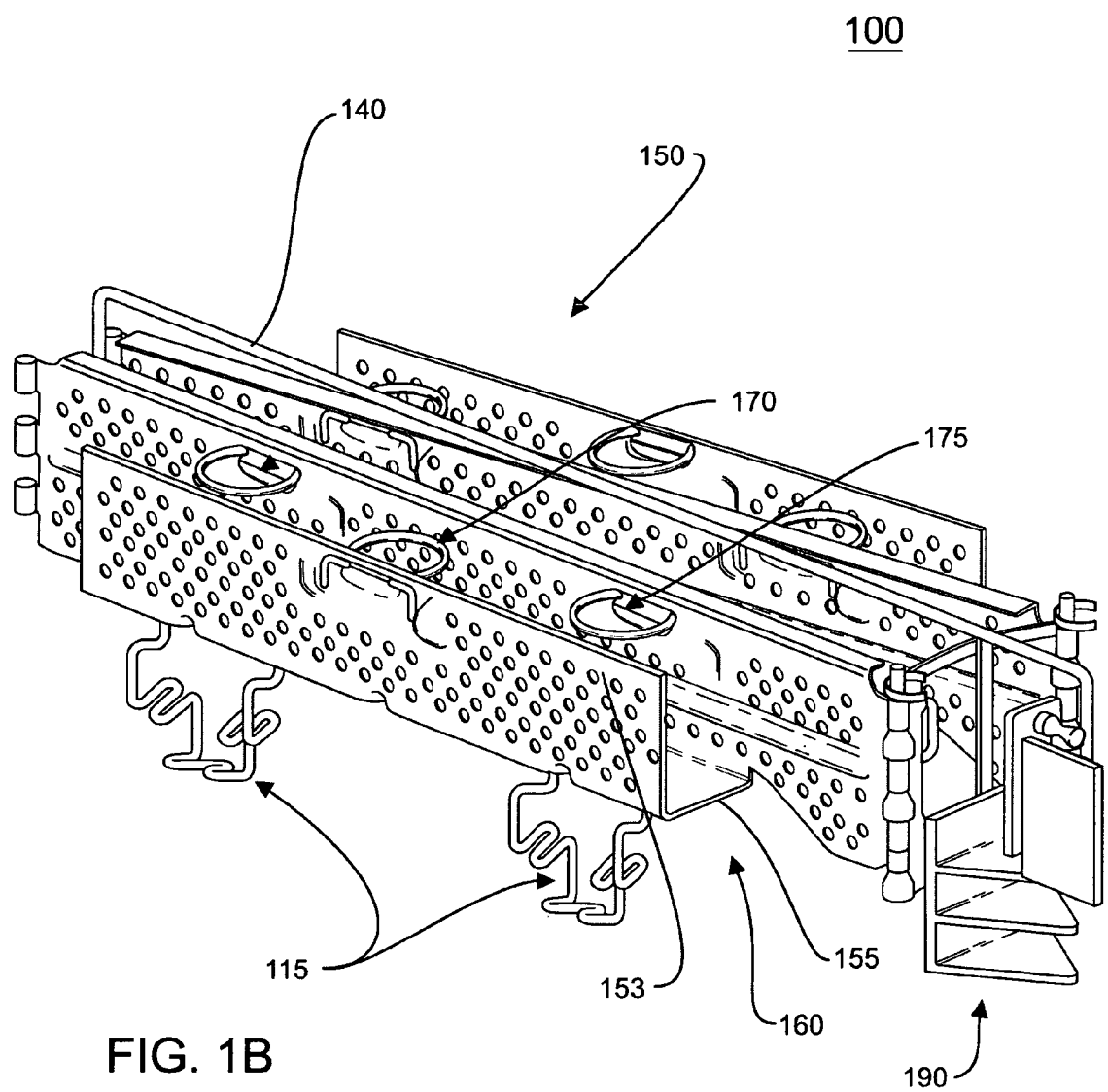
Figure 1C:
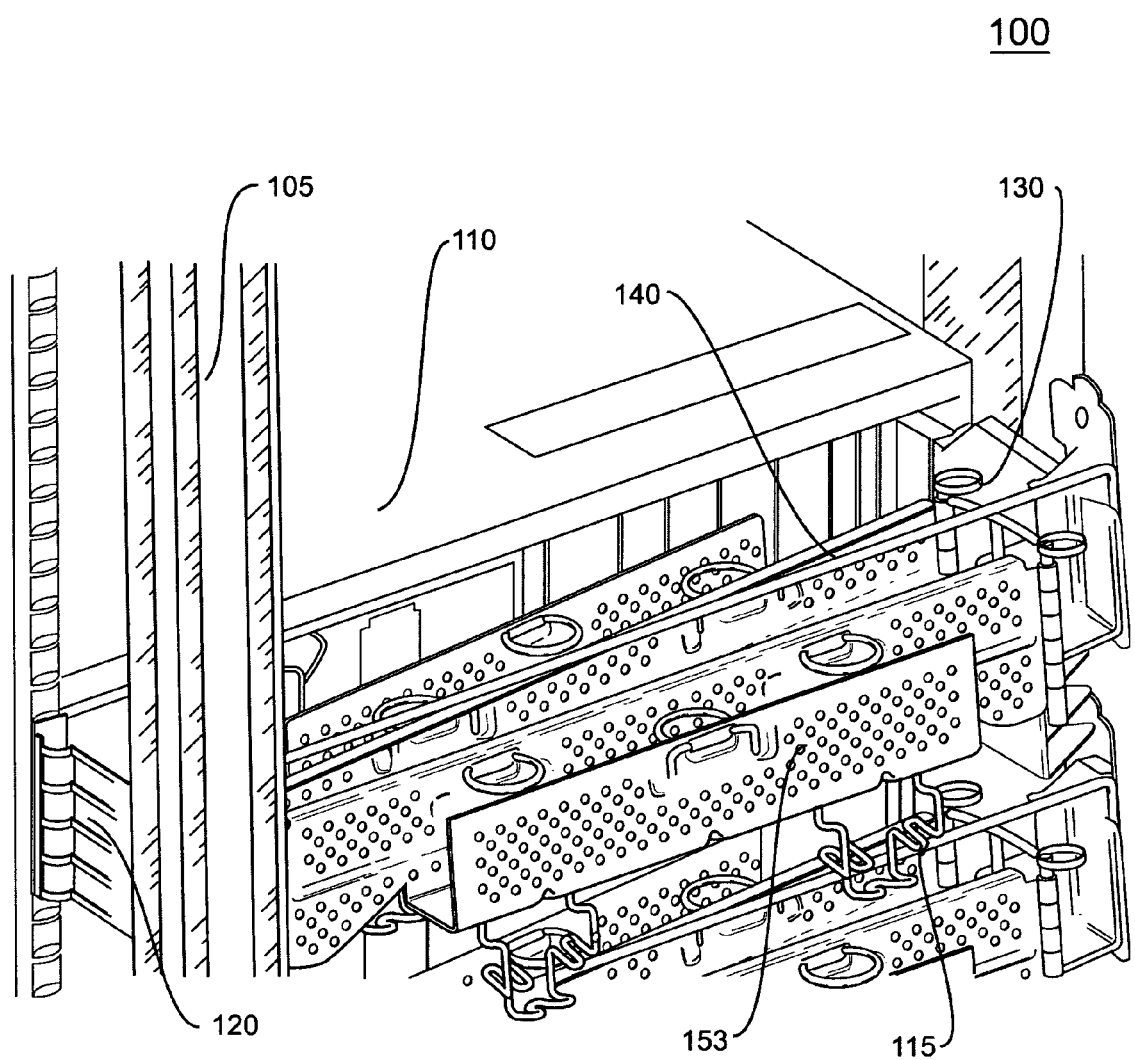

FIGS. 1A, 1B and 1C illustrate one embodiment of an electronic module rack system 100. Similar numbers identify similar structures in FIG. 1A, 1B and 1C. Rack system 100 includes rack housing 105 and opposing first and second rail members 120, 130 attached to the housing. First and second rail members 120, 130 are configured to slide in and out of rack housing 105. In one embodiment, first and second rail members 120, 130 are configured to enable service or installation of an electronic module 110 into rack system 105. First and second rail members 120, 130 are attached to a stabilizer 140. In one embodiment, stabilizer 140 connects first and second rail members 120, 130.

Electronic module 110 is any electronic module to be connected to another device using cables. For example, electronic module 110 is a server in one embodiment. In another example, electronic module is a network device. In another embodiment, electronic module 110 is a personal computer.

Rack system 100 also includes a cable trough assembly 150 supported by the first and second rail members. A cable trough assembly is any device configured to channel and support at least one cable. In one embodiment, cable trough assembly 150 includes at least two arms 160 hingedly attached at one end of each arm and configured to rotate between an open configuration and a closed configuration. An open configuration describes a configuration of the cable trough assembly to enable installation or maintenance of an electronic module. A closed configuration describes a configuration of the cable trough assembly that minimizes the space occupied by the cable trough assembly. In one embodiment, a closed configuration occurs when the arms of the cable trough assembly are substantially parallel to each other, and an open configuration occurs when the arms art substantially in series. In one embodiment; each arm includes two sidewalls 153 connected by a base surface 155. In one embodiment, the base surface 155 is configured so that cables may be laid along the base surface 155 for support. In one embodiment, the hinged attachment is implemented as disclosed in U.S. patent application Ser. No. 11/242,584 filed Sep. 30, 2005 and assigned to the assigned of this application.

In one embodiment, each arm further includes at least a first and second upper retainer 170, 175. Each upper retainer 170, 175 is configured to extend from an opposing side wall 153 a distance greater than one half a width of the base surface 155 and less than three-quarters of the width of the base surface. In one embodiment, a cable to be supported within the cable trough assembly can be placed within the space defined by the base surface 155, sidewalls 153 and a plane defined by an end of sidewalls 153 opposite the base surface 155. In one embodiment, each upper retainer 170, 175 is shaped in a semi-circular configuration. In another embodiment, each upper retainer 170, 175 is shaped in a substantially d-shape. In one embodiment, each upper retainer 170, 175 occupies a portion of the plane defined by an end of sidewalls 153 opposite the base surface 155.

Rack system 100 further includes at least one cable separator retainer 115 extending from the cable trough assembly. Cable separator retainer 115 is configured to support at least one cable outside the space defined by the base surface 155, sidewalls 153 and a plane defined by an end of sidewalls 153 opposite the base surface 155. In one embodiment, cable separator retainer 115 is fixedly attached to the base surface 155. In one embodiment, each cable separator retainer 115 is configured to support a cable featuring specific characteristics, such as bend radii, tackiness of coating, radius, and the like. In another embodiment, each cable separator retainer 115 is configured to support more than one cable featuring specific characteristics, such as bend radii, tackiness of coating, radius, and the like. As used herein, the term 'bend radii' refers to the minimum radius of a bend in the cable that the cable is designed to function properly. In yet another embodiment, cable separator retainer 115 is configured to support any number of cables featuring specific characteristics, such as bend radii, tackiness of coating, radius, and the like, so long as the sum of the diameters taken perpendicular to the primary axis of the cable, of the cables does not exceed the width or depth of the cable separator retainer 115.

In one embodiment, cable trough assembly 150 includes at least one retainer pin assembly 190 extending form the cable trough assembly. Retainer pin assembly 190 is disposed at or near the hinged connection between the first and second arm 120, 130. The retainer pin assembly is configured to define at least one line with at least one cable separator retainer.

FIG. 2 illustrates one embodiment of a method 200 for managing cables for an electronic module, in accordance with one aspect of the invention. Method 200 begins at step 210 with connecting a first cable to the electronic module. The first cable may be any cable for attaching the electronic module either to a power source, or to at least one other electronic module or network. The cable may connect to the electronic module using any appropriate connection such as an RCA connection or Ethernet connection. The connection may also be a fiber optic connection in certain embodiments.

A second cable is connected to the electronic module at step 220. The second cable may be of an identical type as the first cable, or the second cable may be of a different type. In one embodiment, the second cable comprises a relatively tacky or sticky surface material. In another embodiment, the second cable comprises a cable radii that differs from a cable radii of the first cable. As used herein, the term 'cable radii' refers to at least one radius of the cable taken perpendicular to at least one axis of the cable.

The first cable is placed in a cable trough assembly at step 230. In one embodiment, the cable trough assembly is implemented as cable trough assembly 150 as described in FIG. 1. In one embodiment, placing the first cable in a cable trough assembly comprises sliding the cable between a side wall of the cable trough assembly and at least one upper retainer.

The second cable is placed in a cable separator retainer extending from the cable trough assembly at step 240. In one embodiment, placing the second cable in a cable separator retainer includes the method described more fully in FIG. 4 below. In another embodiment, the second cable is affixed to a cable separator retainer by tying or otherwise securing the cable to the cable separator retainer. In another embodiment, the second cable is wound through at least one loop formed into the cable separator retainer.

FIG. 3 illustrates one embodiment of a method 300 for managing cables for an electronic module, in accordance with one aspect of the invention. Method 300 begins at step 310 with connecting a first cable to the electronic module. In one embodiment, step 310 is implemented as step 210 illustrated with reference to method 200 above.

A second cable is connected to the electronic module at step 320. In one embodiment, step 320 is implemented as step 220 illustrated with reference to method 200 above.

The first cable is placed in a cable trough assembly at step 330. In one embodiment, step 330 is implemented as step 230 illustrated with reference to method 200 above.

The second cable is placed in a cable separator retainer extending from the cable trough assembly at step 340. In one embodiment, step 340 is implemented as step 240 illustrated with reference to method 200 above.

The cable trough assembly is rotated between an open and a closed configuration at step 350. In one embodiment, the cable trough assembly includes at least two arms hingedly connected to each other. In one embodiment, the open configuration comprises a configuration wherein each arm is substantially in series with the other arms, while a closed configuration comprises a configuration wherein each arm is substantially parallel to the other arms.

Figure 4:
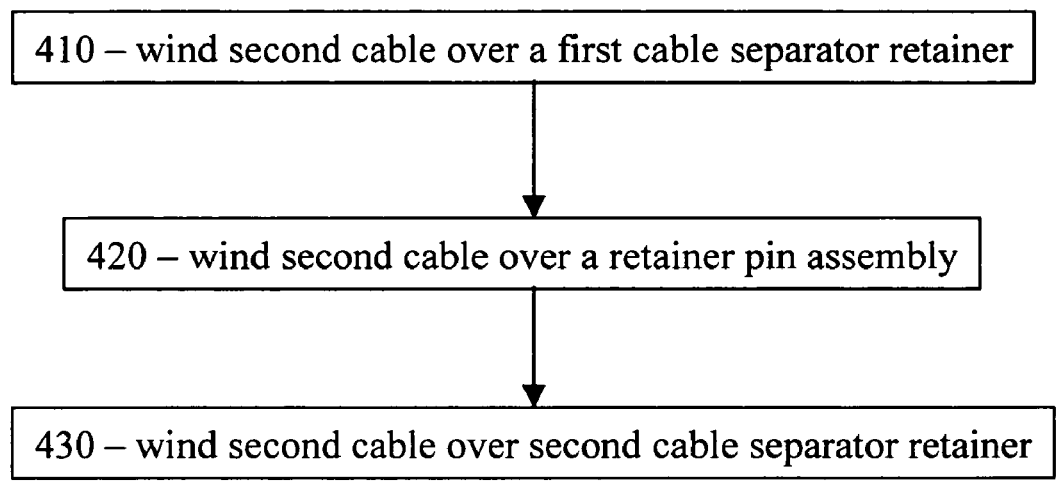
FIG. 4 illustrates an exemplary embodiment of a method for placing a cable in a cable separator retainer in accordance with one aspect of the present invention.

FIG. 4 illustrates one embodiment of a method 400 for placing a second cable in a cable separator retainer. Method 400 includes winding the second cable over a first cable separator retainer at step 410. In one embodiment, winding the second cable over the first cable separator retainer comprises affixing the second cable to the cable separator retainer by any appropriate method.

The second cable is wound over a retainer pin assembly at step 420. In one embodiment, the retainer pin assembly is implemented as retainer pin assembly 190. In one embodiment, winding the second cable over a retainer pin assembly comprises placing the second cable in a groove defining a line with at least one cable separator retainer.

The second cable is wound over a second cable separator retainer at step 430. In one embodiment, step 430 is implemented in a similar fashion as step 410.

While the embodiments of the present invention disclosed herein are presently considered to be preferred embodiments, various changes and modifications can be made without departing from the spirit and scope of the present invention. The scope of the invention is indicated in the appended claims, and all changes that come within the meaning and range of equivalents are intended to be embraced therein.

We claim:

1. An electronic module rack system, comprising:
   a rack housing;
   opposing first and second rail members attached to the housing, the first rail member and second rail member configured to slide in and out of the rack housing;
   a stabilizer bar attached to the first and second rail members;
   a cable trough assembly supported by the first and second rail members;
   at least one cable separator retainer extending from the cable trough assembly,
   wherein the cable trough assembly further includes at least one retainer pin assembly, each retainer pin assembly extending from the cable trough assembly substantially near a hinged connection between a first and a second arm, wherein the retainer pin assembly is configured to define a line with at least one cable separator retainer.

2. The rack system of claim 1 wherein the cable trough assembly includes two arms hingedly attached at one end of each arm, wherein the cable trough assembly is configured to rotate between an open configuration and a closed configuration.

3. The rack system of claim 2 wherein each arm comprises two side walls connected by a base surface.

4. The rack system of claim 3 wherein each arm further includes at least a first and second upper retainer.

5. The rack system of claim 4 wherein each upper retainer is configured to extend from an opposing side wall a distance greater than one half a width of the base surface and less than three-quarters of the width of the base surface.

6. The rack system of claim 1 wherein the cable separator retainer comprises a wire form.

7. The rack system of claim 1 wherein the stabilizer bar extends between the first and second rail members.

8. A cable support system, comprising:
   a cable trough assembly; and
   means for supporting cables outside the cable trough assembly, the means for supporting cables including a rack housing and a first rail member and a second rail member configured to slide in and out of the rack housing wherein the cable trough assembly further includes at least one retainer pin assembly, each retainer pin assembly extending from the cable trough assembly substantially near a hinged connection between a first and a second arm, wherein the retainer pin assembly is configured to define a line with at least one cable separator retainer.

9. The system of claim 8 wherein the cable trough assembly includes at least two arms hingedly attached.

10. The system of claim 9 wherein each arm farther includes at least a first and second upper retainer.

11. The system of claim 10 wherein each upper retainer is configured to extend from an opposing side wall a distance greater than one half a width of a base surface and less than three-quarters of the width of the base surface.

12. The system of claim 8 further comprising a stabilizer bar extending between, and connected to, the first rail member and second rail member.

13. The system of claim 8 wherein the means for supporting cables outside the cable trough assembly comprises a wire form.

14. The system of claim 8 further comprising:
    a rack housing;
    opposing first and second rail members attached to the housing;
    a stabilizer bar attached to the first and second rail members; and
    at least one cable separator retainer extending from the cable trough assembly.

15. An electronic module rack system, comprising:
    a rack housing;
    opposing first and second rail members attached to the housing, the first rail member and second rail member configured to slide in and out of the rack housing;
    a stabilizer bar attached to the first and second rail members;
    a cable trough assembly supported by the first and second rail members;
    at least one cable separator retainer extending from the cable trough assembly,
    wherein the cable separator retainer is configured to support at least one cable outside the space defined by a base surface of the cable trough assembly, sidewall of the cable trough assembly and a plane defined by an end of the sidewall opposite the base surface.

* * * * *